(12) United States Patent
Kittilsland et al.

(10) Patent No.: US 8,421,169 B2
(45) Date of Patent: Apr. 16, 2013

(54) GAP CONTROL FOR DIE OR LAYER BONDING USING INTERMEDIATE LAYERS

(75) Inventors: Gjermund Kittilsland, Tolvsroed (NO); Anders Elfving, Toensberg (NO)

(73) Assignee: Infineon Technologies AG, Neubiberg (DE)

( * ) Notice: Subject to any disclaimer, the term of this patent is extended or adjusted under 35 U.S.C. 154(b) by 306 days.

(21) Appl. No.: 12/800,727

(22) Filed: May 21, 2010

(65) Prior Publication Data

US 2010/0301432 A1  Dec. 2, 2010

(30) Foreign Application Priority Data

May 29, 2009 (EP) .................................. 09161583

(51) Int. Cl.
*H01L 21/00* (2006.01)

(52) U.S. Cl.
USPC ............................................. 257/417; 438/51

(58) Field of Classification Search .................. 257/417; 438/51
See application file for complete search history.

(56) References Cited

U.S. PATENT DOCUMENTS

| 6,884,650 B2 * | 4/2005 | Lee et al. ........................ 438/51 |
| 7,121,402 B2 * | 10/2006 | Van Heerden et al. ....... 206/222 |
| 2002/0007149 A1 | 1/2002 | Nelson et al. |
| 2003/0089394 A1 | 5/2003 | Chang-Chien et al. |
| 2004/0161870 A1 | 8/2004 | Delapierre |
| 2008/0123297 A1 | 5/2008 | Tilton et al. |

FOREIGN PATENT DOCUMENTS

| DE | 199 38 205 A1 | 2/2001 |
| EP | 0 640 784 A1 | 3/1995 |
| GB | 2 212 274 A | 7/1989 |
| WO | WO 2006/061792 A2 | 6/2006 |
| WO | WO 2009/022498 A1 | 2/2009 |

OTHER PUBLICATIONS

European Office Action No. 09161583.1, issue Jan. 18, 2012, 6 pages.

* cited by examiner

*Primary Examiner* — Douglas Menz
(74) *Attorney, Agent, or Firm* — Patterson Thuente Pedersen, P.C.

(57) ABSTRACT

A structure having a gap provided between a portion of two layers that are joined together is disclosed. The structure includes a first layer having an element formed within a first surface and a second layer having a second surface, adjacent to and in direct contact with at least a portion of the first surface on all sides of the element such that the element is completely enclosed. A recess of predetermined depth is arranged to provide the gap between the element and the second surface, and a groove formed in one of the first surface or second surface, the groove defining a boundary around the element. Sealing material is deformedly retained completely within the groove to form a seal around the element, such that the recess defines the gap.

16 Claims, 6 Drawing Sheets

GAP CONTROL FOR DIE OR LAYER BONDING USING INTERMEDIATE LAYERS

RELATED APPLICATION

This application claims priority to European Application No. 09161583, filed May 29, 2009, which is incorporated by reference herein in its entirety.

FIELD OF INVENTION

The invention relates to ways of accurately controlling the dimensions of a gap provided between two layers of a structure being joined together.

BACKGROUND OF THE INVENTION

Micro-electromechanical systems (MEMS), such as accelerometers or gyros, often require a gap to be provided between a portion of two layers. This gap may be required, for example, for capacitive functions in a moving structure of the device, self-test excitation or damping of a moving structure.

In such systems, extremely accurate control of the gap dimensions is required, often down to micron level. Furthermore, the gap often needs to be hermetically sealed, generally in a controlled atmosphere, a gas filled environment or a vacuum.

This combined requirement has limited the bonding methods that are currently possible. Current metal bonds based on solders, eutectic or similar process approaches are of limited use because the required thickness of such layers and the metal float phase of the bonding process makes accurate gap control very difficult.

Furthermore, in a number of applications, there is a need to provide an electrical connection between the main structure and, for example, electrodes or a patterned structure on the sealing part. There is also sometimes a need to provide one or more vertical electrical connections through the whole structure. These are sometimes called vertical through conductors, or through-silicon-vias (TSV).

An existing method of creating a gap between two layers being joined together is based on anodic bonding. A problem with this technique, however, is that the bond members must be of different materials with non-matching mechanical or temperature characteristics, in addition to requiring a high electric field during processing. Other methods of bonding include adhesive bonding, glass fit bonding, direct/fusion bonding and eutectic (e.g. AuSn) bonding. However, although these methods are able to create seals, they are not able to provide very accurate gap control.

SUMMARY

According to embodiments of the invention there is provided a structure having a gap provided between a portion of two layers that are joined together, the structure comprising a first layer having an element formed within a first surface; a second layer having a second surface, adjacent to and in direct contact with at least a portion of the first surface on all sides of the element such that the element is completely enclosed; a recess of predetermined depth arranged to provide the gap between the element and the second surface; a groove formed in one of the first surface or second surface, the groove defining a boundary around the element; and sealing material deformedly retained completely within the groove to form a seal around the element, such that the recess defines the gap.

According to embodiments of the invention there is also provided a method of accurately controlling the dimensions of a gap provided between a portion of two layers joined together, the method comprising providing a first layer with an element formed within a first surface; providing a second layer with a second surface; forming a recess in one of the first surface or second surface, the recess having a predetermined depth; forming a groove in one of the first surface or second surface, the groove defining a boundary for surrounding the element; providing sealing material on at least one of the first surface or second surface; and joining the first layer and second layer together such that the second surface is adjacent to and in direct contact with at least a portion of the first surface on all sides of the element thereby completely enclosing the element, wherein the sealing material is arranged to be deformedly retained completely within the groove such that the recess defines the gap.

BRIEF DESCRIPTION OF THE DRAWINGS

An example of the invention will now be described in detail with reference to one or more of the following figures, in which.

Figure 1A:
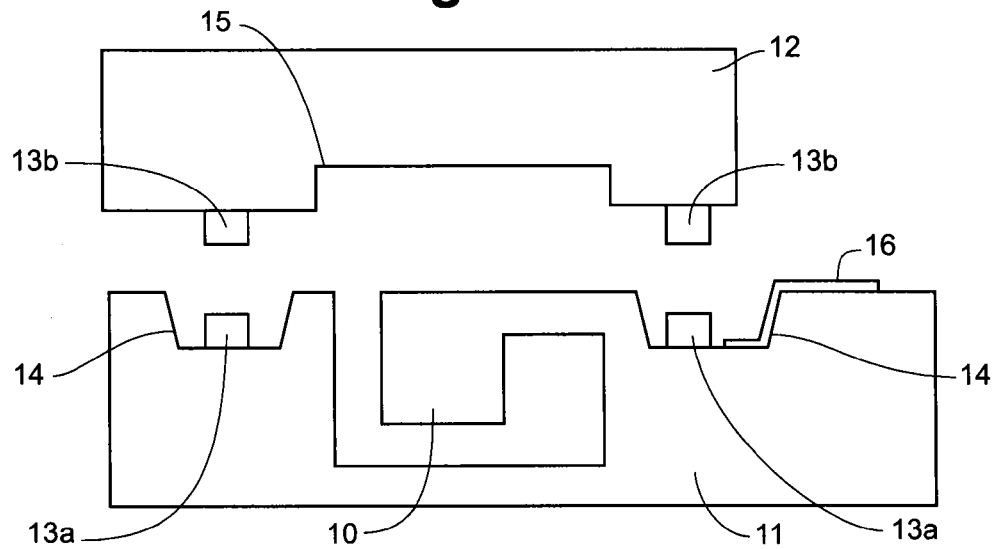
FIGS. 1A and 1B show a first example of an embodiment, having a groove provided in a first layer and a recess provided in a second layer, before and after bonding, respectively.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1A is a cross-section side view of a first layer 11 and a second layer 12 before a bonding process takes place according to a first example of an embodiment.

The first layer 11 comprises an element 10, for example an accelerometer. The second layer 12 comprises a recess 15 provided on the surface that is to be bonded to the first layer 11.

The element 10 is surrounded by a groove 14 which provides a boundary around the element 10 and recess 15. The groove 14 is etched into the surface of the first layer 11 in an embodiment. The groove 14 could, however, be provided in either, or indeed both, the surfaces of the first and second layers 11, 12.

Inside the groove 14 is provided a first portion 13a of sealing material 13, for example metal sealant. A second portion 13b of sealing material 13 is provided on the surface of the second layer 12, surrounding the recess 15. The second portion 13b of sealing material 13 has, in this example, a similar thickness to the first portion 13a of sealing material 13 and is arranged to be aligned with the first portion 13a of sealing material 13 when the first and second layers 11, 12 are joined together, as shown in FIG. 1A.

Figure 1B:
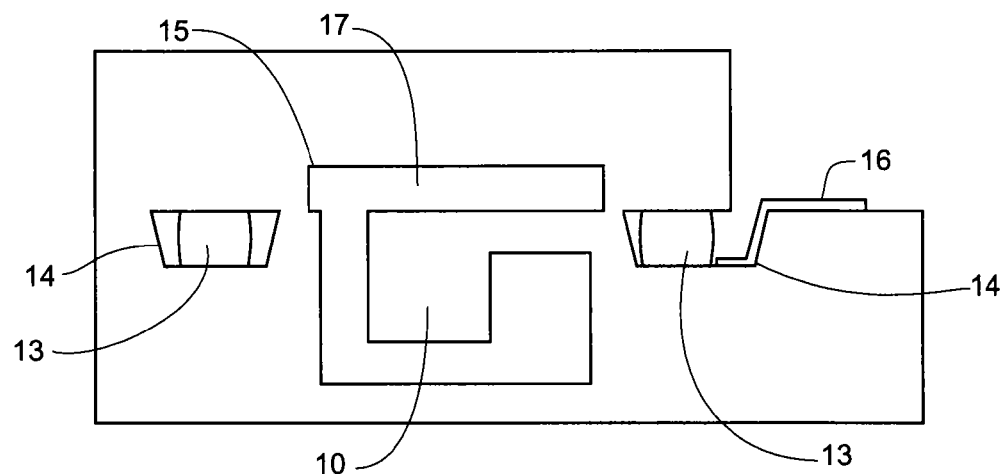

When the first and second layers 11, 12 are bonded together, as shown in FIG. 1B, the first and second portions 13a, 13b of sealing material 13 are brought into contact causing the sealing material 13 to deform laterally within the groove 14, thereby creating a seal around the element 10, as shown in FIG. 1B. The seal is a hermetic seal in an embodiment.

Of course, it will be appreciated that it is not essential that the first and second portions of sealing material are of similar thickness. Furthermore, the first and second portions of sealing material may have different heights and widths, provided that their combined height is greater than the depth of the groove and their width is configured such that, when the first and second layers are bonded together, the sealing material is laterally deformed and, furthermore, entirely retained within the groove.

Indeed, whilst the amount of sealing material provided should be sufficient to ensure that it deforms within the groove, this amount should not be so great that it cannot be entirely accommodated within the groove after the first and second layers have been bonded together. This ensures that the surfaces of the first and second layers are in direct contact, lying adjacent to and flat against one another, after bonding has taken place.

An important feature in an embodiment is therefore that the depth of the groove should be smaller than the overall, combined, thickness of the sealing material to ensure a proper squeeze of the sealing material during the sealing process, but wide enough to fully accommodate the lateral deformation of sealing material.

It will also be appreciated that, in any embodiment, sealing material need only be provided in the groove, or on the surface of the second layer, and not necessarily both, provided a sufficient amount of sealing material is provided to ensure that it is squeezed between the layers and hence deformed within the groove to form a seal when the first and second layers are bonded together, as explained above.

Clearly, if the sealing material is not provided within the groove on one of the layers it should be arranged on the surface of the other layer such that when the first and second layers are bonded together it deforms within the groove.

Once the first and second layers 11, 12 are bonded together, the recess 15 provides a gap 17 above the element 10. Since the recess 15 is formed in the second layer 12 before bonding takes place, and because the surfaces of the first and second layers 11, 12 are bonded flat against one another thanks to the sealing material 13 being completely contained within the groove 14, the known depth of the recess 15 in the second layer 12 is therefore the exact height of the gap 17 provided above the element 10 after bonding.

It can be seen from FIG. 1B that only part of the groove 14 is fully sealed by the second layer 12 in this example and, further, that an electrical contact 16 may also be provided in part of the groove 14 on the structure to allow electronic signals to pass to and from the element 10.

Figure 2A:
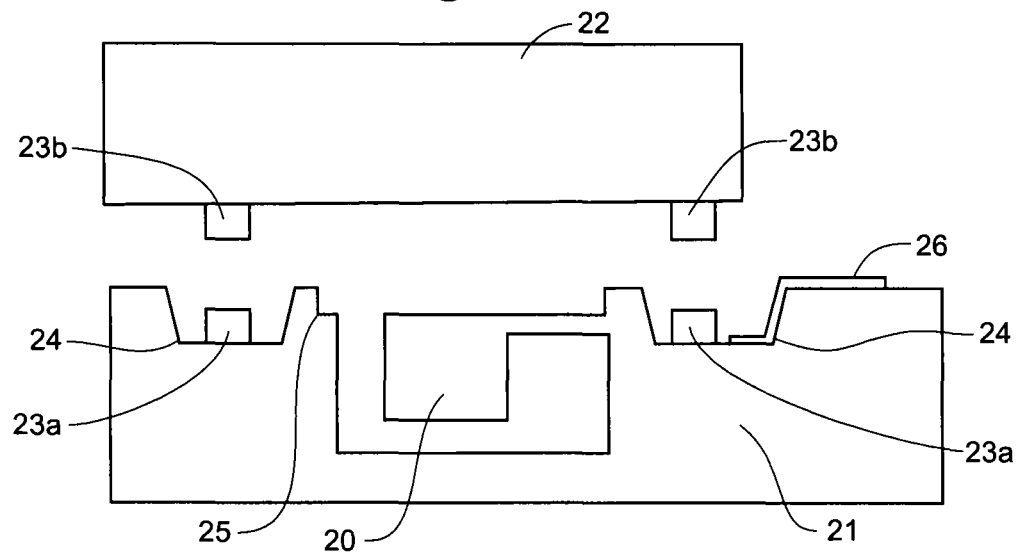
FIGS. 2A and 2B show a second example of an embodiment, having both a groove and a recess provided in a first layer, before and after bonding, respectively.
Figure 2B:
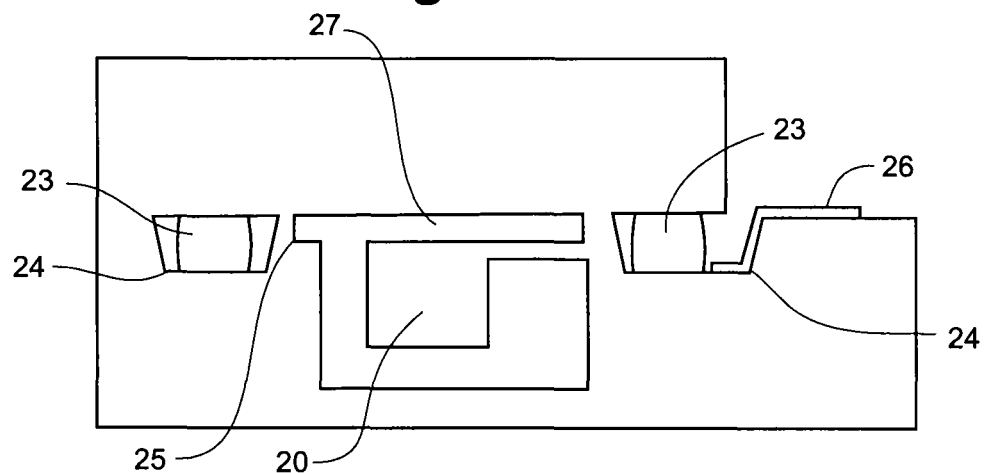

FIGS. 2A and 2B show a second a further example, which is essentially the same as the first example, with the exception that no recess is provided in the surface of the second layer 22. Instead, the gap 27 is created and its dimensions controlled by forming a recess 25 in the surface of the first layer 21 by positioning the element 20 a predetermined and precise amount below the surface of the first layer, thereby effectively providing a precisely dimensioned gap 27 between the element 20 and the surface of the second layer 22.

As with the previous example, a groove 24 containing deformed sealing material 13 provides a seal around the element 20. It will be appreciated, however, that although in this example the groove 24 is provided in the surface of the first layer, the groove could be provided in the surface of the second layer 22 to provide the same result.

Figure 3A:
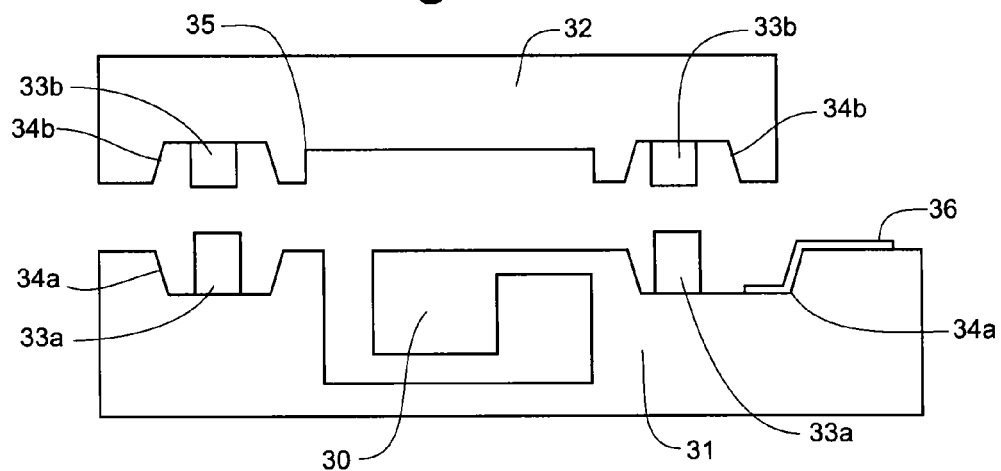
FIGS. 3A and 3B show a third example of an embodiment, having a groove provided in both the first and second layers and a recess provided in a second layer, before and after bonding, respectively.
Figure 3B:
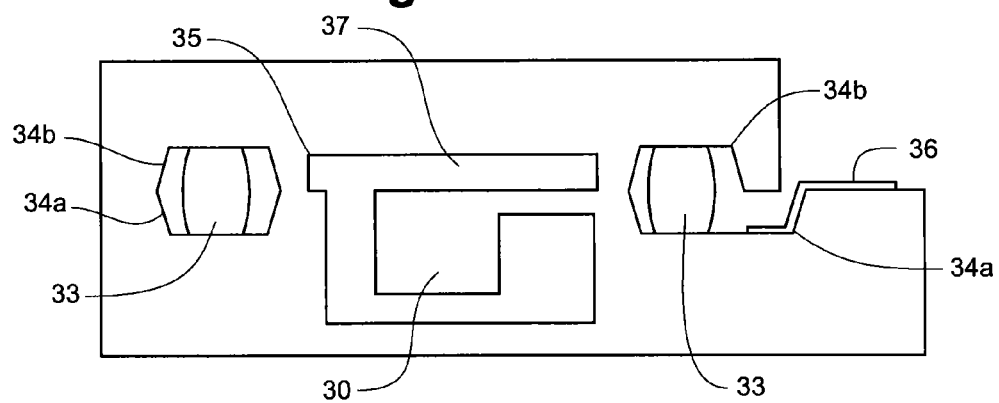

Alternatively, in a third example, as shown in FIGS. 3A and 3B, a groove 34a, 34b is provided in the surface of both the first and second layers 31, 32, with first and second portions of sealing material 33a, 33b provided in each of the grooves 34a, 34b, respectively. As with the previous examples, the sealing material 33 is deformedly retained in the grooves 34a, 34b, when the first and second layers are joined, to form a seal around the element 30.

It will, of course, be appreciated that the recess 35 could be provided on the surface of either the first or second layer 31, 32 to form the gap 37 between the element 30 and the surface of the second layer 32.

Alternatively, a recess could be provided in the surfaces of both the first and second layers and/or a groove could be provided on the surface of both layers, if desired.

Accordingly, embodiments can be performed by providing the groove or recess on either the first or second layer surfaces, or even both, if desired.

Figure 4A:
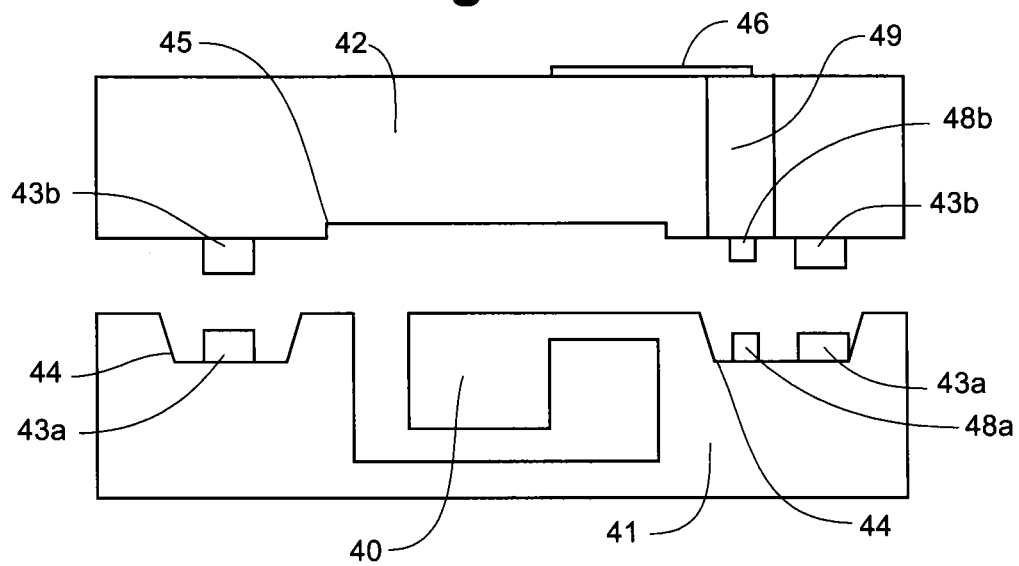
FIGS. 4A and 4B show a fourth example of an embodiment, having an electrical interconnect in combination with a vertical through conductor, before and after bonding, respectively.

A fourth example is shown in FIG. 4A, which comprises a similar arrangement to the examples described above. This further example, however, has the additional feature of a vertical through conductor 49, also sometimes called a through silicon via (TSV), provided in the second layer 42. The TSV 49 provides an electrical connection between a contact 46, provided on an upper surface of the second layer 42, and the first layer 41, as follows.

A first portion 48a of electrical connection material 48, for example gold or copper, is provided in the groove 44 that is formed in the surface of the first layer 41 and surrounds the element 40. The electrical interconnect material 48 can be arranged either on the element 40 side of the sealing material 43, or on the outer side of the sealing material 43.

A corresponding second portion 48b of, in an embodiment, the same, or a similar, electrical interconnect material 48 is arranged on a lower surface of the second layer 42. In this example, the TSV 45 is arranged to pass through the second layer 42 so that it connects the electrical contact 46 on the upper surface of the second layer 42 with the second portion 48b of electrical interconnect material 48 provided on the lower surface of the second layer 42. Of course, a TSV could alternatively, be arranged to pass through the first layer 41 or, indeed, both first and second layers 41, 42, if desired.

In a similar manner as the seal formed by the sealing material 43, sufficient electrical interconnect material 48 is provided so that when the first and second layers 41, 42 are bonded together an electrical connection is formed by the first and second portions 48a, 48b of electrical interconnect material 48 being squeezed together such that they deform within the groove 44 to form a secure electrical connection. As with the sealing material, the heights and widths of the electrical interconnect material can vary, provided that it is caused to deform within the groove when the first and second layers are bonded together.

Figure 4B:
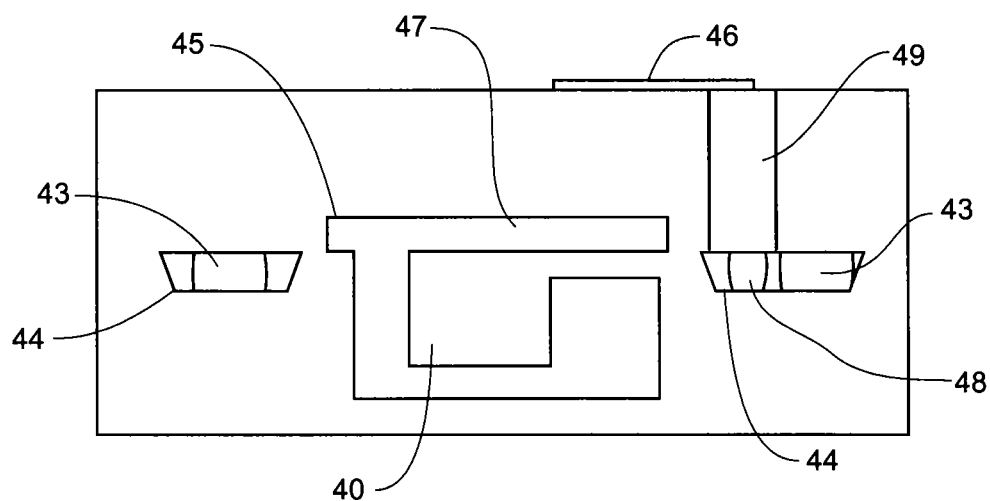

FIG. 4B shows the first layer 41 and the second layer 42 joined together after bonding. As with the previous examples, the sealing material 43 in the groove 44 has been squeezed together and has subsequently deformed to provide a seal around the element 40. In addition, the electrical interconnect material 48 has also been squeezed together and deformed within the groove 44 to provide a secure electrical connection.

The groove 44 must therefore be of an appropriate size to accommodate both the sealing material 43 and the electrical interconnect material 48 after deformation in an embodiment, such that the surfaces of the first layer 41 and the second layer 42 are in full contact after bonding has taken place. Alternatively, an electrical connection could be formed by the electrical interconnect material 48 being deformed within a separate groove portion (not shown).

In addition, the groove 44 may be fully covered by the second layer 42, as shown in the example of FIG. 4B.

As previously explained, the sealing material 43 and/or, electrical interconnect material 48 could alternatively be provided only on the surface of one of the layers 41, 42, provided that the overall height of the material 43, 48 is greater than the depth of the groove 44 that it is intended to deform in such that when the layers 41, 42 are brought together it deforms within the groove 44.

Figure 5A:
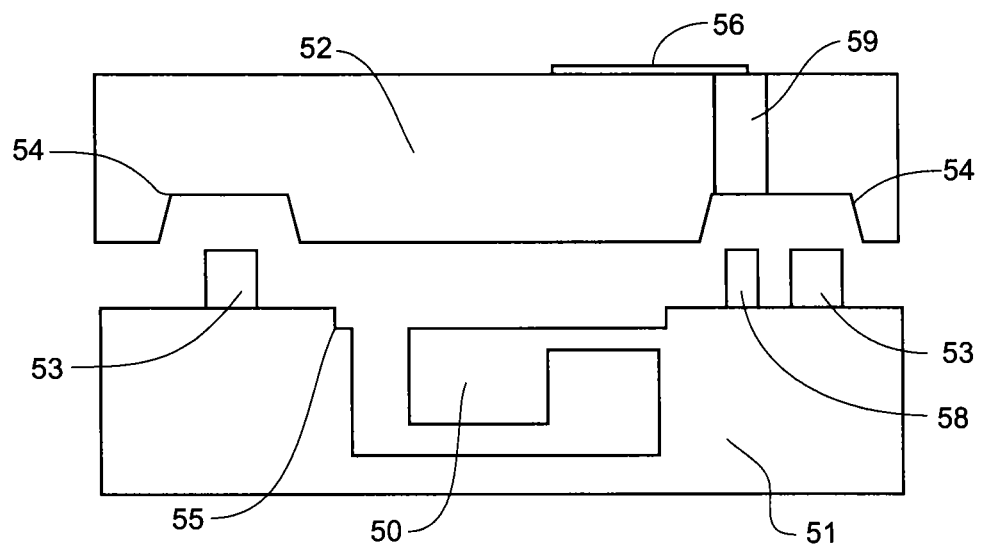
FIGS. 5A and 5B show a fifth example of an embodiment, having an electrical interconnect material in combination with a vertical through conductor, before and after bonding, respectively.
Figure 5B:
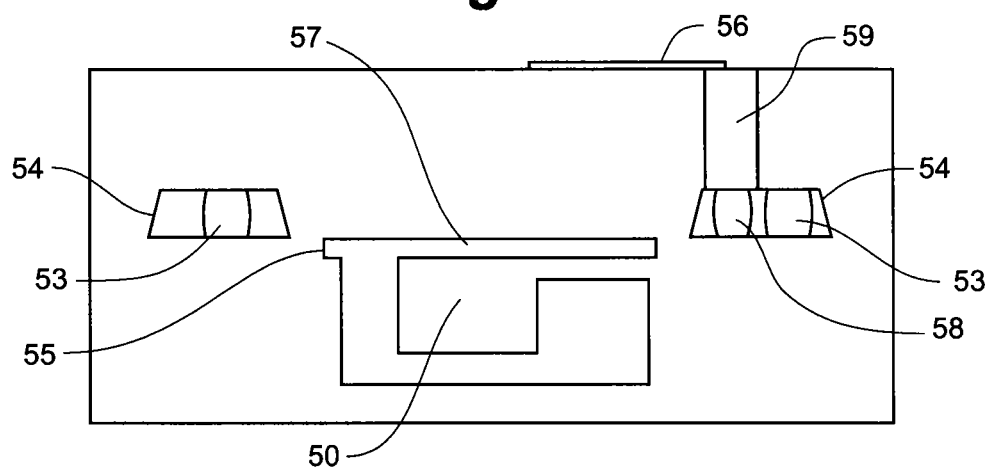

FIGS. 5A and 5B show a fifth example that is substantially the same as the fourth example described above, with the exception that the groove 54 is provided in the surface of the second layer 52 and the recess 55 is provided in the surface of the first layer 51.

Furthermore, in this example, the sealing material 53 and electrical interconnect material 58 are only provided on the first layer. However, as outlined previously, sufficient amounts of sealing material 53 and electrical interconnect material 58 are provided to ensure that their respective heights are both greater than the depth of the groove 54. Thus, when the first and second layers 51, 52 are bonded together, the sealing material 53 and electrical interconnect material 58 are both deformedly retained within the groove 54, as can clearly be seen from FIG. 5B.

It can also be seen how a gap 57 is formed between the element 50 provided in the first layer 51 and the surface of the second layer 52, the dimensions of the gap 57 being accurately controlled by the dimensions of the recess 55.

Figure 6A:
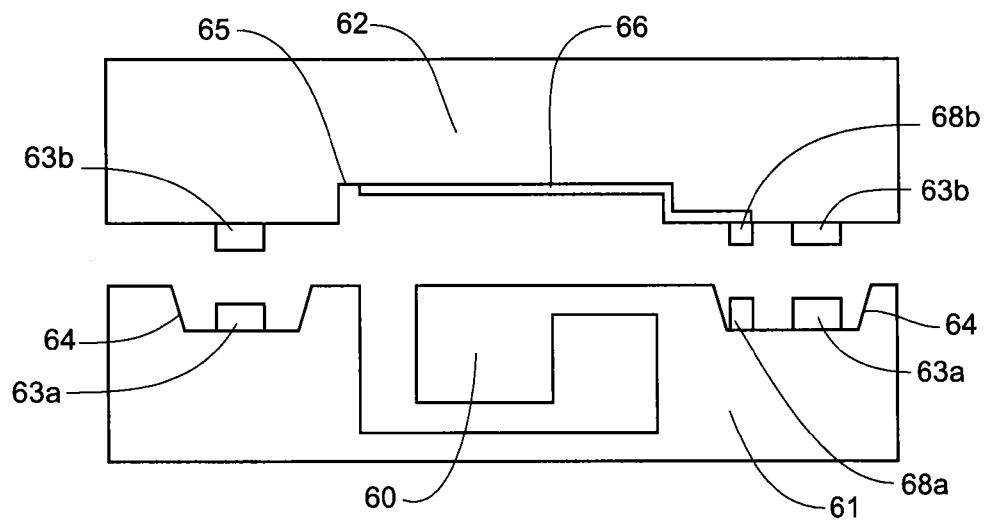
FIGS. 6A and 6B show a sixth example of an embodiment, having an electrical interconnect in combination with an electrode, before and after bonding, respectively.
Figure 6B:
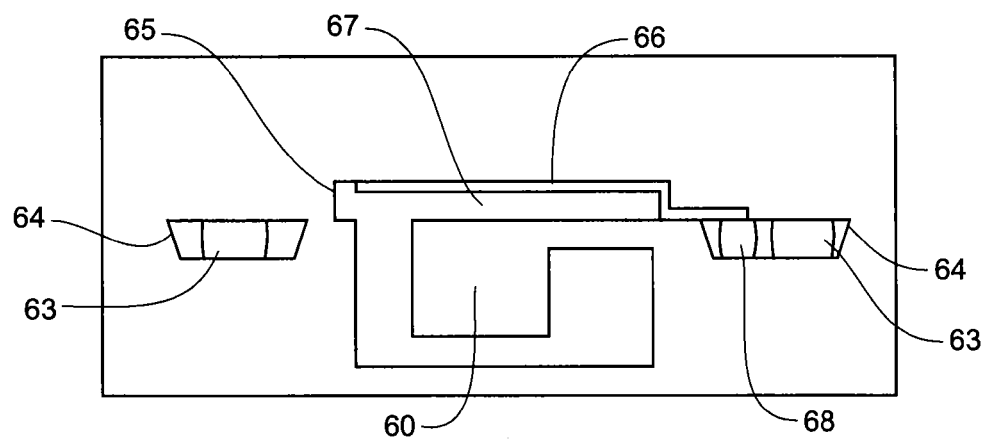

The TSV may be replaced by, for example, an electrode or a patterned structure/layer. FIGS. 6A and 6B show a sixth example of the present invention that is substantially the same as the fourth example, with the exception that the TSV has been replaced by an electrode 66 situated, in this example, in the recess 65 formed in the surface of the second layer 62.

In FIG. 6B it can be seen how the first and second portions 68a, 68b of electrical interconnect material 68 are aligned such that, on bonding the first and second layers 61, 62 together, the first and second portions 68a, 68b of interconnect material 68 are squeezed together such that they are deformed, in the same manner as the first and second portions 63a, 63b of sealing material 63, in a portion of groove 64, to form an electrical connection between the first layer 61 and the electrode 66 provided on the surface of the second layer 62.

As mentioned above, the electrode could be substituted by a patterned structure or one or more component(s) suitable for sending and/or receiving an electrical signal.

As will be understood from the above described examples, an advantage of embodiments is that the dimensions of a gap provided above an element can be accurately created and controlled independently of the sealing process between two layers. Embodiments enable gap dimension control to be extremely accurate, even when providing a hermetic seal around an element when bonding two layers, because it is known that the surfaces of the layers will be in full surface contact with one another.

In particular, embodiments eliminate the variable of the gap dimension, previously introduced by an inability to accurately control the thickness of sealing material between two bonded layers, when designing components requiring accurately controlled gap dimensions. In addition, the thickness of the seal can be controlled by the amount of sealing material provided, together with the depth and width of the groove without having any effect on the gap provided above the element.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:
1. A structure having a gap provided between a portion of two layers that are joined together, the structure comprising:
 a first layer having an element formed within a first surface;
 a second layer having a second surface, adjacent to and in direct contact with at least a portion of the first surface on all sides of the element such that the element is completely enclosed;
 a recess of predetermined depth arranged to provide the gap between the element and the second surface;
 a groove formed in one of the first surface or the second surface, the groove defining a boundary around the element; and sealing material mechanically deformed and retained completely within the groove to form a seal around the element, such that the recess defines the gap.

2. The structure of claim 1, wherein the element is substantially coplanar with the first surface of the first layer and the recess is formed in the second surface of the second layer to a predetermined depth equal to the height of the gap desired.

3. The structure of claim 1, wherein the recess is formed by the element being recessed below the first surface of the first layer by a predetermined depth equal to the height of the gap desired.

4. The structure of claim 1, wherein a groove is formed in both the first surface of the first layer and the second surface of the second layer.

5. The structure of claim 4, wherein one or more grooves are completely covered between the first layer and second layer.

6. The structure of claim 1, wherein the groove is completely covered between the first layer and second layer.

7. The structure of claim 1, further comprising an electrical interconnect material deformedly retained within at least a portion of the groove.

8. The structure of claim 7, further comprising a vertical through conductor provided in one of the first layer or the second layer and arranged to electrically connect a surface of the first layer or the second layer with the other of the first layer or the second layer via the electrical interconnect material.

9. The structure of claim 7, further comprising one of an electrode or a patterned structure provided on a surface of one of the first layer or the second layer and arranged to electrically connect with the other of the first layer or the second layer via the electrical interconnect material.

10. A method of accurately controlling the dimensions of a gap provided between a portion of two layers joined together, the method comprising:
   providing a first layer with an element formed within a first surface;
   providing a second layer with a second surface;
   forming a recess in one of the first surface or the second surface, the recess having a predetermined depth;
   forming a groove in one of the first surface or the second surface, the groove defining a boundary for surrounding the element;
   providing sealing material on at least one of the first surface or the second surface; and
   joining the first layer and the second layer together such that the second surface is adjacent to and in direct contact with at least a portion of the first surface on all sides of the element, thereby completely enclosing the element, wherein the joining causes the sealing material to be mechanically deformed and retained completely within the groove such that the recess defines the gap.

11. The method of claim 10, further comprising forming the recess in the first surface by recessing the element below the first surface of the first layer to a predetermined depth equal to the gap desired.

12. The method of claim 10, further comprising forming a groove in both the first surface of the first layer and the second surface of the second layer.

13. The method of claim 12, wherein an overall height of the sealing material provided on the at least one of the first surface or the second surface is greater than a combined depth of the one or more grooves.

14. The method of claim 10, further comprising completely covering the groove between the first layer and second layer when the first layer and the second layer are bonded together.

15. The method of claim 10, further comprising providing an electrical interconnect material on at least one of the first surface or the second surface, wherein the electrical interconnect material is arranged to be deformedly retained completely within a portion of the groove when the first layer and second layer are bonded together.

16. The method of claim 10, wherein an overall height of the sealing material provided on the at least one of the first surface or the second surface is greater than depth of the groove.

\* \* \* \* \*